United States Patent [19]

Tsukiboshi

[11] Patent Number: 6,074,430
[45] Date of Patent: Jun. 13, 2000

[54] AUTOMATIC CELL PLACING METHOD

[75] Inventor: Yoshiki Tsukiboshi, Shinjuku-ku, Japan

[73] Assignee: Kabushiki Kaisha Toshiba, Kawasaki, Japan

[21] Appl. No.: 08/955,452

[22] Filed: Oct. 21, 1997

[30]     Foreign Application Priority Data

Oct. 21, 1996  [JP]  Japan ..................................... 8-278409

[51] Int. Cl.[7] ................................................. G06F 17/50
[52] U.S. Cl. ................................................. 716/9; 716/17
[58] Field of Search .................................... 364/488, 489, 364/490, 491; 395/500.08, 500.09, 500.1, 500.11, 500.12; 716/1, 2, 8, 9, 10, 17

[56]              References Cited

U.S. PATENT DOCUMENTS

| | | | |
|---|---|---|---|
| 5,682,321 | 10/1997 | Ding et al. ............................... | 364/490 |
| 5,808,901 | 9/1998 | Cheng et al. ............................ | 364/491 |
| 5,815,403 | 9/1998 | Jones et al. .............................. | 364/489 |
| 5,818,727 | 10/1998 | Sekiguchi ................................ | 364/490 |
| 5,831,863 | 11/1998 | Scepanovic et al. .................... | 364/488 |
| 5,838,585 | 11/1998 | Scepanovic et al. .................... | 364/491 |
| 5,850,350 | 12/1998 | Shibuya et al. .......................... | 364/491 |
| 5,892,688 | 4/1999 | Scepanovic et al. .................... | 364/491 |

OTHER PUBLICATIONS

Yang et al. "Halo: An Efficient Global Placement Strategy for Stranded Cells," IEEE International Symposium on Circuits and Systems, p. 448–451, May 1990.

Cheng and Ho "SEFOP: A Novel Approach to Data Path Module Placement," 1993 IEEE/ACM International Conference on Computer–Aided Design, p. 178–181, Nov. 1993.

Mayrhofer and Lauther "Congestion–Driven Placement Using a New Multi–Partitioning Heuristic," 1990 International Conference on Computer–Aided Design, p. 332–335, Nov. 1990.

Costa et al. "Automatic Generation of Symbolic Cells from a Net–list Description," Proceedings, CompEuro '89, VLSI and Computer Peripherals, VLSI and Microelectronic Applications in Intelligent Peripherals and their Interconnection Networks, p.5/35–5/5/3, May 1989.

Wang and Chen "A Simultaneous Placement and Global Routing Algorithm for an FPGA with Hierarchical Interconnection Structure," 1996 IEEE International Symposium on Circuits and Systems, p. 659–662, May 1996.

Hill "Alternative Strategies for Applying Min–Cut to VLSI Placement," Proceedings of the 1988 IEEE International Conference on Computer Design: VLSI in Computers and Processors, p. 440–444, Oct. 1998.

*Primary Examiner*—Paul R. Lintz
*Assistant Examiner*—Leigh Marie Garbowski
*Attorney, Agent, or Firm*—Foley & Lardner

[57]              ABSTRACT

In a placing design employing standard cell system, a series of steps of merging, improving arraying in one-dimensional array and division are fundamentally alternately repeated to obtain a two-dimensional array of a plurality of cells which have relations interconnections. In the automatic cell placing method, since division is always performed after merging, placing obtained in the previous step can be corrected resulting in placing design having small dispersion in wiring density distribution.

12 Claims, 13 Drawing Sheets

AUTOMATIC CELL PLACING METHOD

BACKGROUND OF THE INVENTION

The present invention relates generally to a automatic cell placing method and, more particularly, to an automatic cell placing method of two-dimensionally arraying cells in a placing design of a semiconductor device according to a standard cell system.

The standard cell system placing method has hitherto been employed in the placing design of a semiconductor integrated circuit.

FIG. 17 is a layout diagram illustrating a semiconductor device which has been designed employing a standard cell system placing method.

According to this method, to start with, logic circuit/logic blocks are optimally designed by combining basic logic circuits to have high performance with minimum occupied area. Then they are registered as standard cells in a computer. Then, when designing a semiconductor device, a variety of standard cells registered are selected and combined, thereby making a cell placing design. As illustrated in FIG. 17, desired cells 141, 142, etc. are arranged in a plurality of rows on the semiconductor integrated circuit including external terminals 145, 146, etc., and a cell placing, a cell row interval and a wiring pattern are determined to minimize a total sum of wire lengths of wires, 143, 144, etc. for connecting the respective cells to the external terminals.

A minimum-cut method is known as a typical algorithm for the cell placing, etc. (See I. Bhandari et al. "The Min-cut Shuffle: Toward a Solution for the Global Effect Problem of Min-Cut Placement" 25th ACM/IEE Design Automation Conference, Paper 41.6, pp. 681–685, 1988 IEEE, etc.). According to this minimum-cut method, a two-dimensional coordinate placing of the cells involves dividing large cell groups, minimizing the number of connection nets between the divided cell groups, thereafter sequentially subdividing the cell groups, then minimizing the number of connection nets between these subdivided cell groups, and repeating such operations.

In the above-described minimum-cut method, however, an emphasis is put on the number of nets (signal lines) for connecting the cells to clusters, and therefore a difference in terms of length among wires is easy to occur. Further, if large and small basic cells are intermingled, there tends to be a bias in a distribution of connecting terminals as a whole as in the case of a concentration of the small cells.

This being the case, what is described above might lead to an increase in chip size of the whole, which might therefore bring about a rise in production costs. Moreover, since it is difficult to meet a requirement for circuit operation timing necessary for the circuit operation, there are caused increases both in design costs and in design period due to repetitive design works.

SUMMARY OF THE INVENTION

It is an object of the present invention to provide an automatic cell placing method capable of remarkably reducing production costs, a design period and design costs by enhancing a degree of integration in a placing design based on a standard cell system and completing a desired placing design by a signal design work.

According to the first aspect of the present invention, there is provided an automatic cell placing method comprising:

an arraying step of forming a cell group by arraying a plurality of cells one-dimensionally in a lengthwise direction or a crosswise direction by only lengthwise or crosswise components of external terminals per column or row on the basis of connection data of the respective cells; and a dividing step of dividing the cell groups formed in said arraying step into a predetermined number of cell groups per column or row in the lengthwise or crosswise direction, wherein said automatic cell placing method is based on a standard cell system in which the plurality of cells are laid out two-or-more-dimensionally to have a predetermined number of rows or columns by alternately repeating respective processing operations in said arraying step and said dividing step with respect to the lengthwise components and the crosswise components.

According to the second aspect of the present invention, there is provided an automatic cell placing method of executing a placing design of a semiconductor device by a standard cell system, comprising:

a lengthwise one-dimensional arraying step of forming a first cell group by arraying a plurality of cells per column one-dimensionally in a lengthwise direction by only lengthwise components of external terminals on the basis of connection data of the respective cells;

a lengthwise dividing step of forming a second cell group by executing $2^n$-divisions (n is the number of processing operations and is an integer), per column, of the lengthwise cell group formed in said lengthwise one-dimensional arraying step;

a crosswise merging step of forming a third cell group by merging, per row and per crosswise direction, the cell groups obtained by effecting the divisions in said lengthwise dividing step;

a crosswise one-dimensional arraying step of forming a fourth cell group by arraying the third cell group per row one-dimensionally in the crosswise direction by only crosswise components of the external terminals, said third cell group being obtained by the merging process in said crosswise merging step;

a crosswise dividing step of forming a firth cell group by executing, per row, $2^n$ divisions (n is the number of processing operations and is an integer) of the fourth cell group formed in said crosswise one-dimensional arraying step; and a lengthwise merging step of forming the fifth cell group by merging, per column the cell groups obtained by the divisions in said crosswise dividing step, wherein the plurality of cells are laid out two-or-more-dimensionally by appropriately repeating a series of lengthwise operating processes of said lengthwise merging step, said lengthwise one-dimensional arraying step, and said lengthwise dividing step, and a series of crosswise processing operations of said crosswise merging step, said crosswise one-dimensional arraying step and said crosswise dividing step in the lengthwise or crosswise direction in accordance with a predetermined number of rows and a predetermined number of columns.

According to the present invention, two-dimensional arrays of a plurality of cells bearing a connecting relationship are actualized by simply repeating one-dimensional arraying and dividing processes and a merging process. As a flow of processes, for example, there are repeated the following steps: (1) a lengthwise one-dimensional arraying, (2) a lengthwise dividing, (3) a crosswise cell group merging, (4) a crosswise one-dimensional arraying process, (5) a crosswise dividing and (6) a lengthwise cell group merging. Alternatively, there may be repeated (1) a crosswise one-dimensional arraying, (2) a crosswise dividing, (3) a lengthwise cell group merging, (4) lengthwise one-dimensional arraying, (5) a lengthwise dividing and (6) a crosswise cell group merging.

Owing to such an processing flow, an ideal placing design with a less bias in distribution density of connecting pins within the cells can be obtained at a high speed.

Further, the placing method of the present invention, because of repetitive dividing and merging operations based on the simple one-dimensional array, is highly suited to meeting the path constraints of making an influence by a floor plan of the whole semiconductor device hard to receive, and giving a constraint to a signal delay time between the flip-flops in the circuit, or giving a one-dimensional cell array constraint.

DESCRIPTION OF THE PREFERRED EMBODIMENTS

An automatic cell placing method according to the present invention will hereinafter be described in detail.

Figure 1:
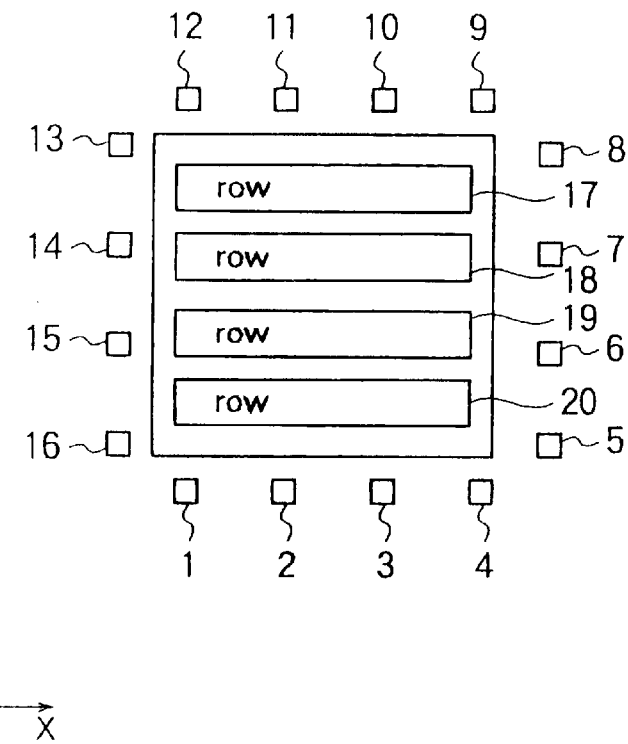
FIG. 1 is a placing schematic diagram of a chip of a semiconductor integrated circuit according to the present invention.

Referring first to FIG. 1, there is shown a diagram of an outline of a placing of a semiconductor integrated circuit to which the present invention is applied.

Referring again to FIG. 1, by way of one example, terminals 1–16 are those for inputting from outside or externally outputting, and coordinates thereof have already been determined. Further, it is assumed that respective cells are optimally arrayed as a four cell rows respectively including cell groups 17–20 on the chip of the semiconductor integrated circuit. Moreover, each cell bears several items of connection data, e.g., a cell width, a cell length or a cell area, a name of an input net (signal) to the cell, an input terminal number, a name of an output net (signal) from the cell and an output terminal number, etc. These connection data can be determined for each cell by use of known connection description languages, etc.

Figure 2:
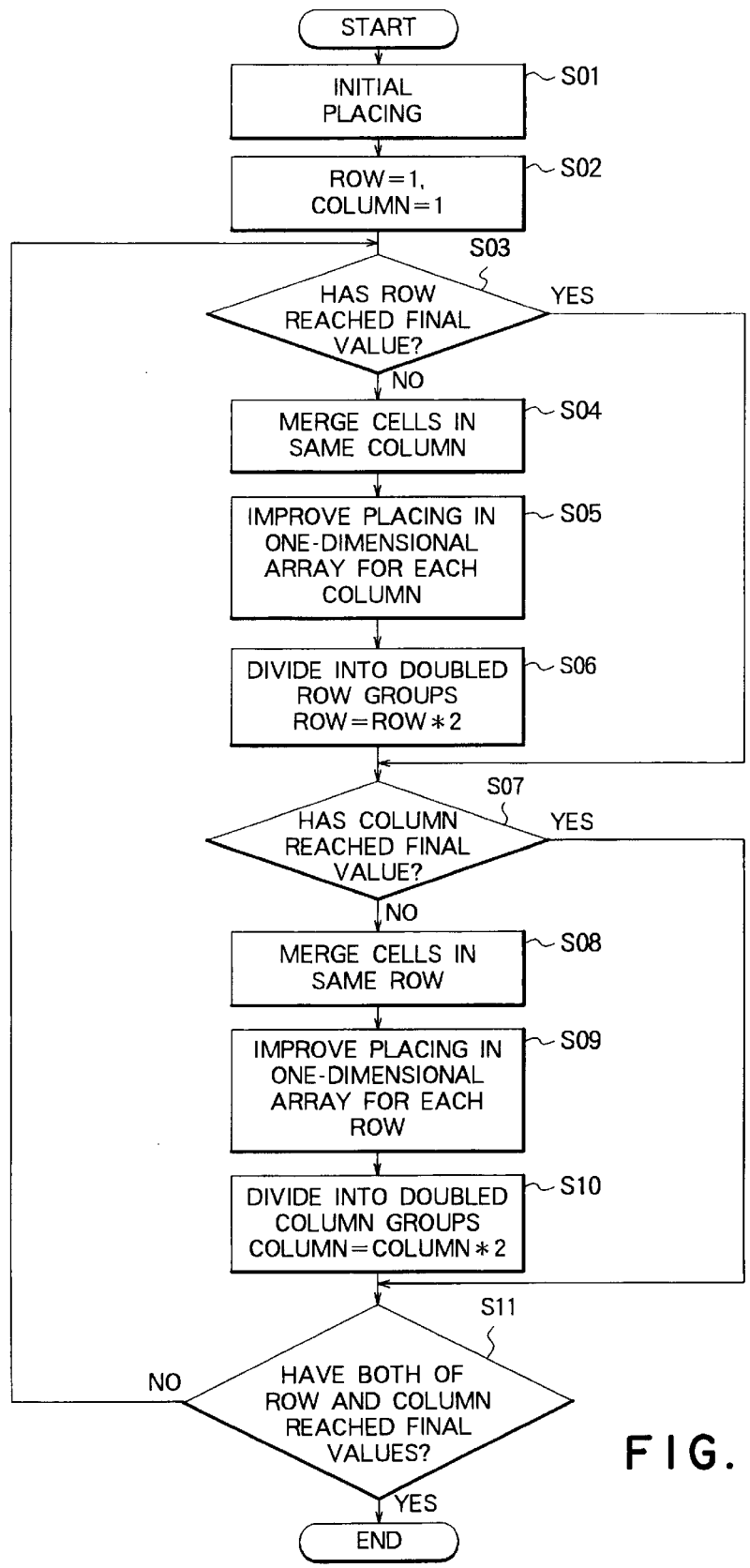
FIG. 2 is an operation flowchart of an automatic cell placing method according to a first embodiment of the present invention.

FIG. 2 is a flowchart of operations by the automatic cell placing method according to the present invention.

To begin with, an initial placing of cells (step S01) is performed. In this step, cell information of all cells is one by one taken out from a storage section (not shown) by an order of their identifier names, then initial cell locations of desired cells are determined based on relations between a cell and the external terminals connected to the cell and relations between the cell concerned and other cells connected to the cell concerned in such a manner that wiring length connected to the cell becomes minimum. More practically, cells connected to the external terminals are firstly placed then cells connected to the cells connected to the external terminals are secondary placed in such a manner that total wiring length of the desired cell becomes minimum. These procedures are repeated and determined cell locations is assumed as an initial placement of cells.

Then, the number of rows and the number of columns are initialized (step S02). That is, initial values of the number of rows and the number of columns are both set to [1].

Next, whether or not the number of rows reaches a final value, is judged (step S03). Note that the final values of the number of rows and of the number of columns, it is assumed, be preset. Herein, by way of one example of a semiconductor integrated circuit having cell arrangement having 4 columns 4 rows, it is assumed that the final values of the rows and of the columns are each preset to [4]. If the number of rows has reached the preset final value, the processing moves to a processing operation (step S07) for judging the number of columns.

Figure 3A:
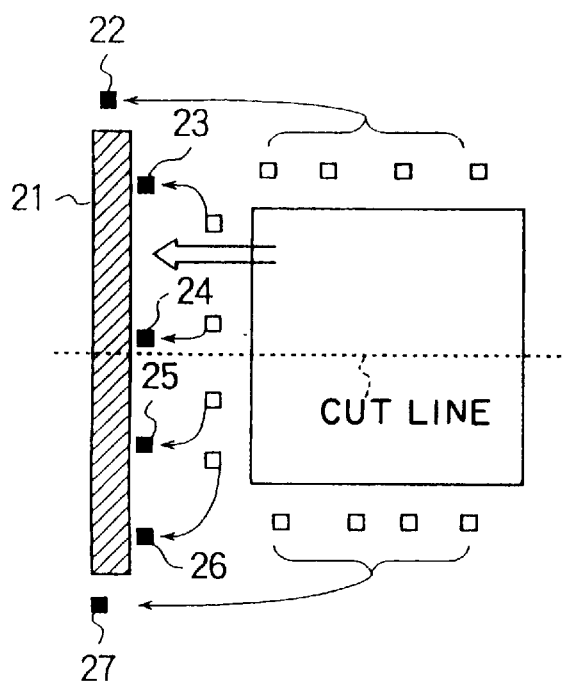
FIGS. 3A and 3B are schematic diagrams of a semiconductor integrated circuit in which a lengthwise one-dimensional array has been carried out.
Figure 3B:
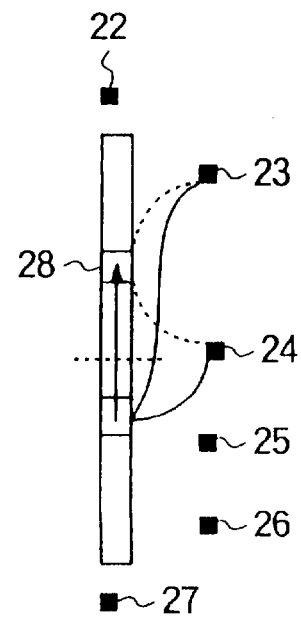

When the number of rows does onto reach the final value, the cells in the same column are merged (step S04) to obtain one-dimensionally arrayed cells in the lengthwise direction. FIGS. 3A and 3B are schematic diagrams of the semiconductor integrated circuit on which the cells are one-dimensionally arrayed in the lengthwise direction. As shown in FIG. 3A, a group of terminals 1–4 and a group of terminals 9–12 respectively belong to the same Y-coordinates and are therefore respectively disposed at one points 22 and 27 respectively located in the upper and lower end positions. Since there is only one row at the beginning, there must be a state where all the cells are merged. For example, as shown in FIG. 3A, the all cells on the chip of the semiconductor integrated circuit are arranged in one column in the lengthwise direction shown as a cell group 21.

Next, the one-dimensionally arrayed column group is sorted based on the connection data by only Y-axial components, thus improving the placing (step S05). For this purpose, an ideal Y-coordinate of each cell is obtained from position data of the external terminals as well as net data with other cells connected to the cell concerned on the basis of connection information of the cell concerned. More specifically, the ideal Y-coordinate of each cell is calculated as Y-axial position where, for example, a sum of wiring lengths takes a minimum value taking concentration status of wirings into consideration. For instance, as shown in FIG. 3B, the ideal Y-coordinate of the cell 28 is calculated as a position of 28' in consideration of a positional relationship between terminals 23 and 24 which are connected to the cell 28, from the cell connection data. Such ideal coordinate is generally obtained as a point of balance with connecting destinations.

Then, after calculations have been implemented with respect to all the cells, the placing improved one-dimensional array is obtained by sorting with the ideal Y-coordinates of cells. Such sorting process may be repeated several times according to the necessity, whereby an ideal one-dimensional placing can be also obtained.

Next, the thus obtained one-dimensional array is divided into two cell groups to obtain two row groups of up and down (step S05). After being divided, the number of rows is set double. Namely, the following relation is defined.

Number of rows=(number of rows)*2

Figure 4:
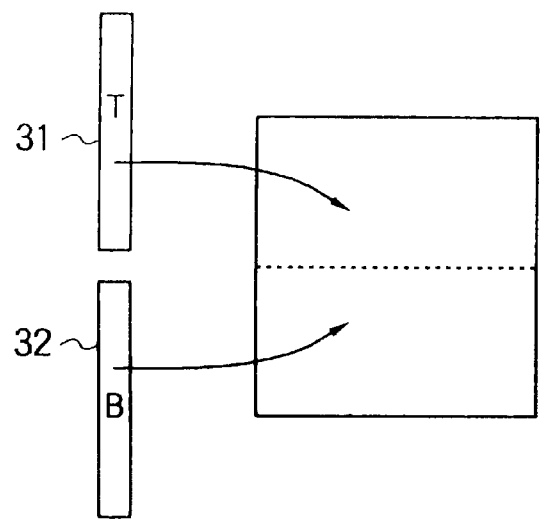
FIG. 4 is a schematic diagram of a semiconductor integrated circuit in which a lengthwise dividing has been effected with respect to the lengthwise one-dimensional array.

FIG. 4 is a diagram showing a scheme of the semiconductor integrated circuit in which the lengthwise one-dimensional array is divided in the lengthwise direction. With this operation, an array having two one-dimensional arrays which are vertically divided and consisting of cell groups (T)31 and (B)32, is obtained.

Next, whether or not the number of columns reaches the final value, is judged (step S07). If the number of columns has reached the preset final value, the processing moves to a judging operation (step S11) for judging the number of rows and the number of columns. In step S11, the both of the numbers of the rows and columns have reached the final values, the processing comes to an end.

Herein, if the number of columns does not reach the final value (step S07), the cells in the same row are merged (step S08).

Figure 5:
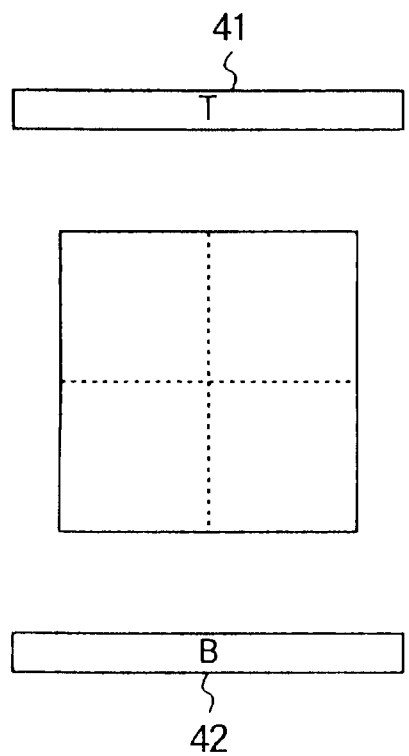
FIG. 5 is a schematic diagram of a semiconductor integrated circuit in which a crosswise cell group merging process and an improvement of the crosswise one-dimensional array have been executed with respect to the crosswise one-dimensional array.

FIG. 5 is a schematic diagram showing the semiconductor integrated circuit in which the crosswise cell groups in a crosswise one-dimensional array are merged, and the crosswise one-dimensional array is improved.

The number of columns is "1" for each divided row at the beginning, and there must be a state where all the cells in each row are merged. Herein, the terminals 7, 8 and the terminals 13, 14, which correspond to the cell group 31, are equal to each other in terms of X-coordinates and therefore disposed respectively at one right and left and points.

Similarly, the terminals 5, 6 and the terminals 15, 16, which correspond to the cell group 32, are also equal to each other in their X-coordinates and therefore disposed respectively at one right and left end points.

Furthermore, the thus obtained one-dimensional arrays are place improved (step S09). More specifically, similar to the procedure for column as described above, the placing of the obtained up-and-down two crosswise cell groups (T)41, (B)42 is improved by the sorting process in consideration of only the X-axial components on the basis of the connection data with respective external terminals, etc.

Figure 6:
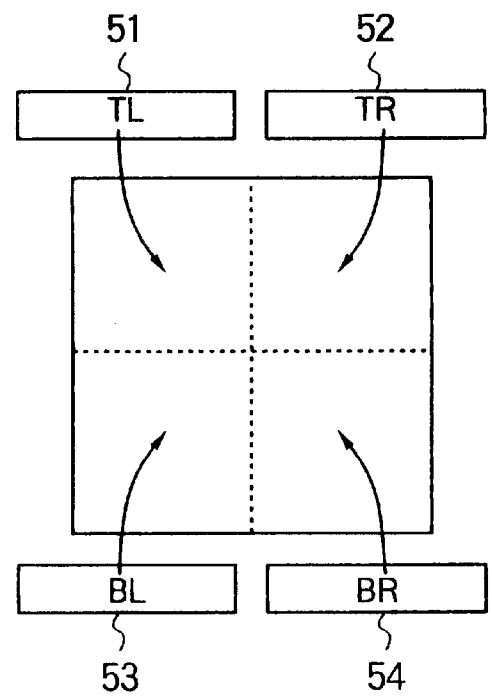
FIG. 6 is a schematic diagram of a semiconductor integrated circuit in which a crosswise dividing process has been carried out.

Next, the cell groups (T)41 and (B)42 in the respective columns, the placing of which has been improved, are each divided into two groups (step S10), resulting in doubled number of rows. FIG. 6 is a schematic diagram showing the semiconductor integrated circuit in which the crosswise divisions have been effected.

Thus, the whole cell groups are subdivided into four cell groups, (TL)51, (TR)52, (BL)53 and (BR)54, wherein the number of rows is [2] and the number of columns is [2].

Next, the operations starting from step S03 are to be repeated. That is, the number of rows is [2] at present and does not yet reach the final value [4] (step S03), and hence the cell groups divided in FIG. 6 are merged in the every same right and left columns (step S04).

Figure 7A:
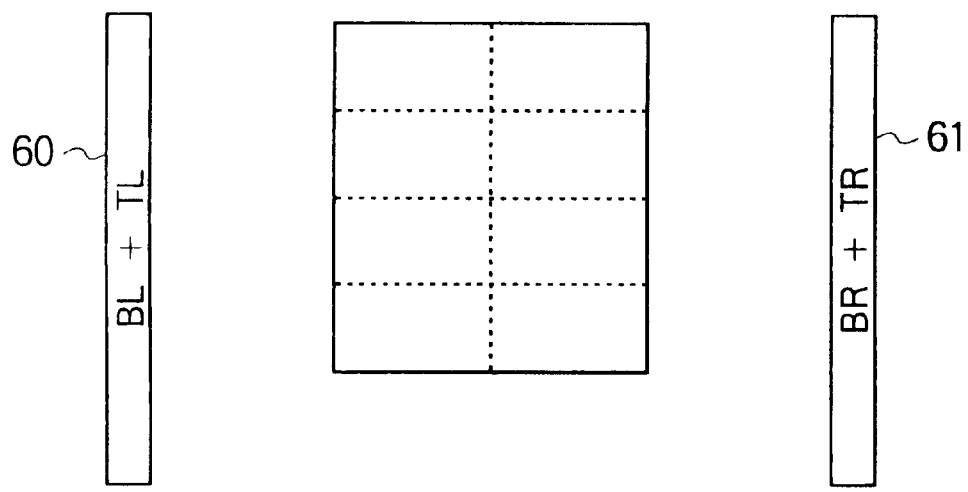
FIGS. 7A and 7B are schematic diagrams of a semiconductor integrated circuit in which a lengthwise cell group merging process, and arraying and dividing processes have been executed.
Figure 7B:
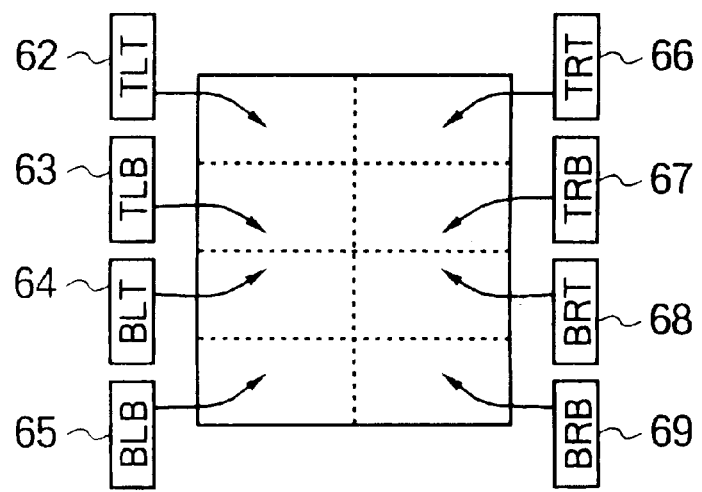

FIGS. 7A and 7B are schematic diagrams of the semiconductor integrated circuits in which the lengthwise cell groups are merged, arrayed and divided.

Herein, as illustrated in FIG. 7A, a cell group (BL+TL)60 is obtained by merging cell groups (TL)51 and (BL)53. Similarly, a cell group (BR+TR)61 is obtained by merging cell groups (TR)52 and (BR)54. Hereinbelow, as described above, the cell groups 60, 61 are sorted per column in the lengthwise direction on the basis of the cell connection data in step S04, thus improving the placing. Further, thereafter, as shown in FIG. 7B, in step S05, the cell groups are divided per column. Herein, after completion of second processing, the cell group is divided into four groups. Namely, the cell group 60 is divided into cell groups (TLT)62, (TLB)63, (BLT)64 and (BLB)65, and the cell group 61 is divided into cell groups (TRT)66, (TRB)67, (BRT)68 and (BRB)69.

Further, the operations from step S07 are repeated. That is, the number of columns is [2] and does not yet reach the final value [4] (step S07), and therefore the cell groups divided into the four groups in FIG. 7B are merged per row (step S07).

Figure 8A:
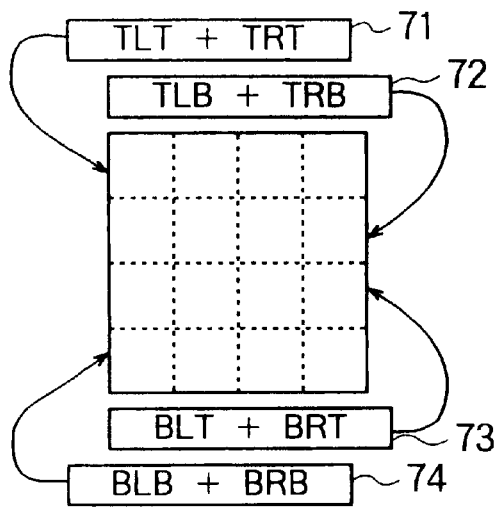
FIGS. 8A and 8B are schematic diagrams of a semiconductor integrated circuit in which a crosswise cell group merging process, and arraying and dividing processes have been executed.
Figure 8B:
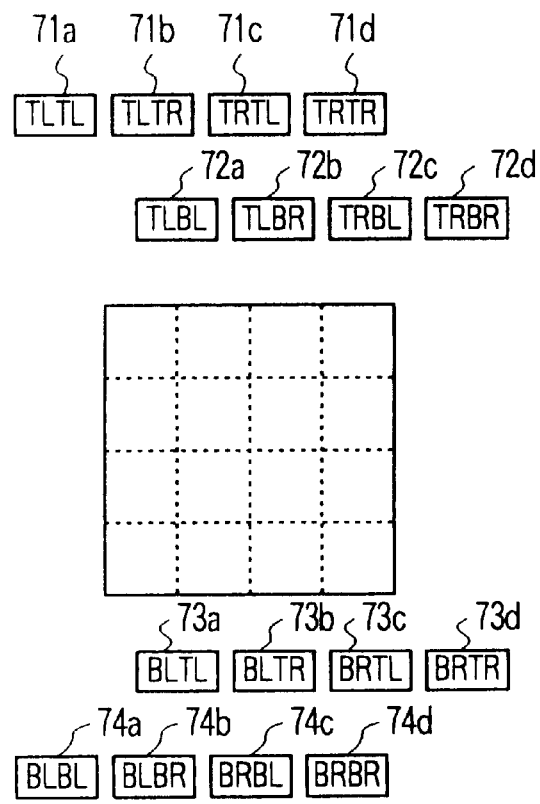

FIGS. 8A and 8B are schematic diagrams of the semiconductor integrated circuits in which the crosswise cell groups are merged, arrayed and divided.

Herein, as illustrated in FIG. 8A, a cell group (TLT+TRT) 681 is constructed by merging cell groups (TLT)62 and (TRT)66. Similarly, a cell group (TLB+TRB)72 is constructed by merging cell groups (TLB)63 and (TRB)67. A cell group (BLT+BRT)73 is constructed by merging the cell groups (BLT)64 and (BRT)68, and a cell group (BLB+BRB) 74 is constructed by merging the cell groups (BLB)65 and (BRB)69.

Hereinbelow, as described above, the cell groups 71–74 are sorted per column in the crosswise direction on the basis of the cell connection data in step S09, thus improving the placing. Further, thereafter, as shown in FIG. 8B, in step S10, the cell groups are divided. Herein, the processing is the second time, and hence the cell group is divided into four groups per row. Namely, the cell group (TLT+TRT)71 is divided into cell groups 71a(TLTL), 71b(TLTR), 71c (TRTL) and 71d(TRTR). Similarly, the cell group 72 is divided into cell groups 72a–72d, the cell group 73 is divided into cell groups 73a–73d and the cell group 74 is divided into cell groups 74a–74d.

Now, because of having reached the initialized number of rows [4] and the initialized number of columns [4], and therefore the processing comes to an end via step S11.

Figure 9:
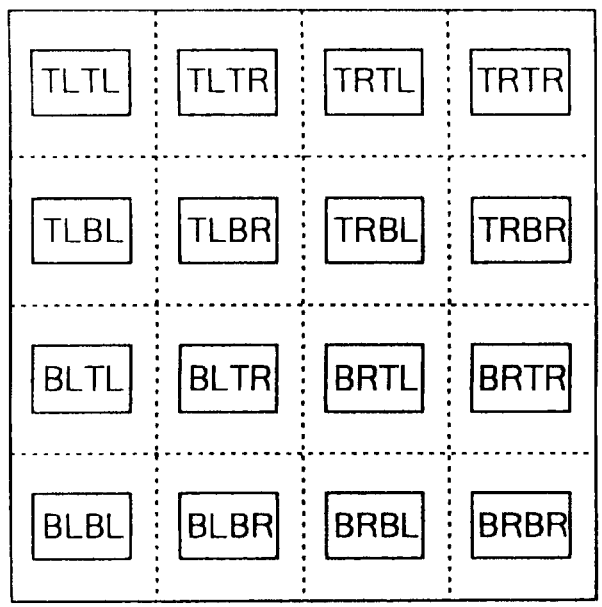
FIG. 9 is a schematic diagram of a semiconductor integrated circuit in which cells have been laid out by processing operations according to the present invention.

FIG. 9 is a schematic diagram of the semiconductor integrated circuit in which the 16 cells are arrayed by the processing operations described above according to the present invention. Thus, the cells or the cell groups are arranged in allocated positions on the chip of the semiconductor integrated circuit.

Figure 10:
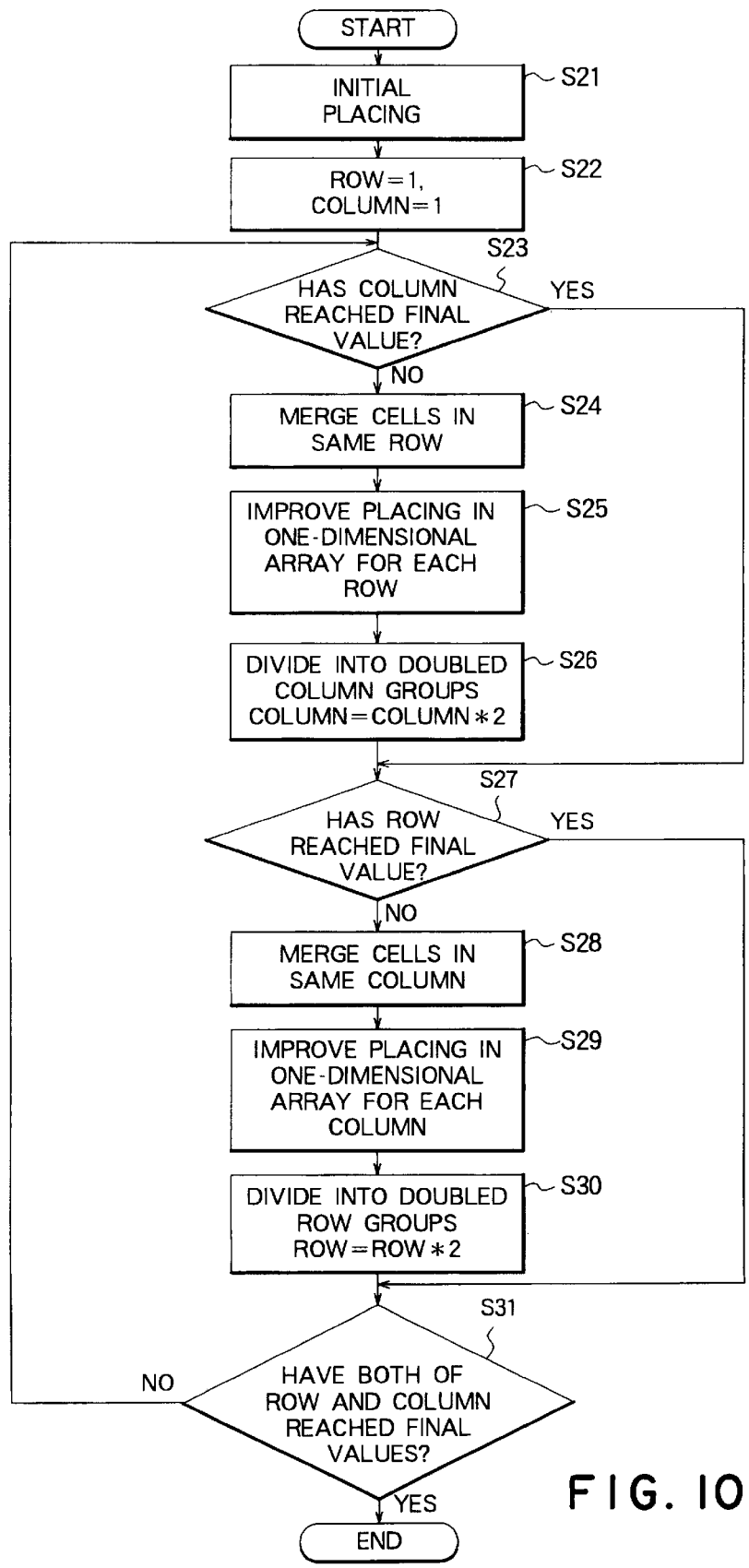
FIG. 10 is an operation flowchart of an automatic cell placing method according to a second embodiment of the present invention.

In the description of the embodiment discussed above, the cells are previously arranged in one column in the lengthwise direction. The processing can be also, however, executed after previously one-dimensionally arraying the cells in the crosswise direction. FIG. 10 is a flowchart showing such embodiment. In this figure, steps of S21, S22, S31 and S32 respectively correspond to steps of S01, S02, S11 and S12 in FIG. 2, steps S23–S26 in FIG. 10 correspond to S07–S10 in FIG. 2, and steps of S27–S30 in FIG. 10 correspond to S03–S06 in FIG. 2, respectively. Detailed explanation of FIG. 10 is omitted.

It should be noted that in the embodiments of FIG. 2 and FIG. 10, the number of columns and rows can take different figures.

Hereinafter, a specific automatic cell placing in which the cells are previously one-dimensionally arrayed in the crosswise direction and then the processing is executed, will be described in detail based on a simple example.

It is herein assumed that eight pieces of cells No. 1–No. 8 are arrayed on the chip of the semiconductor integrated circuit. Further, supposing that these cells are arrayed in two rows and in four columns, the number of rows to be set is [2], and the number of columns to be set is [4].

The cell connection data include a connecting relationship with the external terminals, a connecting relationship with other cells and sizes of the cells etc., and are given in a connection describing language etc. such as, e.g., "and (N002, P001, N001)".

The example of this connection describing language shows that a cell kind is [and gate] and has a predetermined size, the input net (signal) is [P01] and [N001], and the output net is [N002].

Figure 11A:
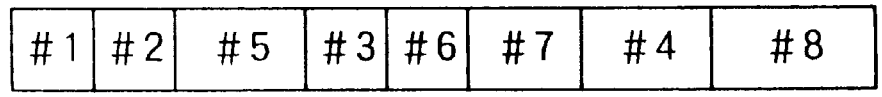
FIGS. 11A and 11B are schematic diagrams of a semiconductor integrated circuit in which a crosswise one-dimensional array and a crosswise dividing have been effected.
Figure 11B:
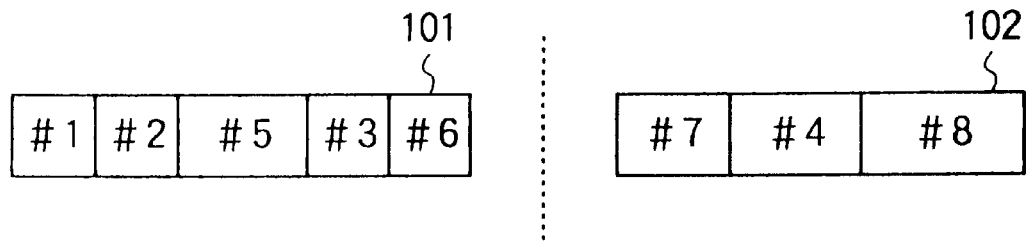

FIGS. 11A and 11B are schematic diagrams of the semiconductor integrated circuits in which the cells are one-dimensionally arrayed in the crosswise direction and divided in the crosswise direction.

As illustrated in FIG. 11A, the cells No. 1–No. 8 are one-dimensionally arrayed in the crosswise direction on the basis of the connection data with respect to only the X-direction, and this array is sorted by making use of the positional relationship of the respective central points of the cells No. 1–No. 8, thereby improving the placing, on this occasion, there may utilized a positional relationship between the respective points of four corners, i.e., a right upper point and left lower point etc. of each cell.

Next, as shown in FIG. 11B, the one-dimensional cell array is divided into two cell groups. On this occasion, as explained above, the cell array may be divided into the two cell groups at the central point of each cell or a desired point of the four corners. Further, the cell array may be divided by making use of an area ratio. Thus, the division is set so that a cell group 101 consists of the cells No. 1, No. 2, No. 5, No. 3 and No. 6, while a cell group 102 consists of the cells No. 7, No. 4 and No. 8.

Figure 12A:
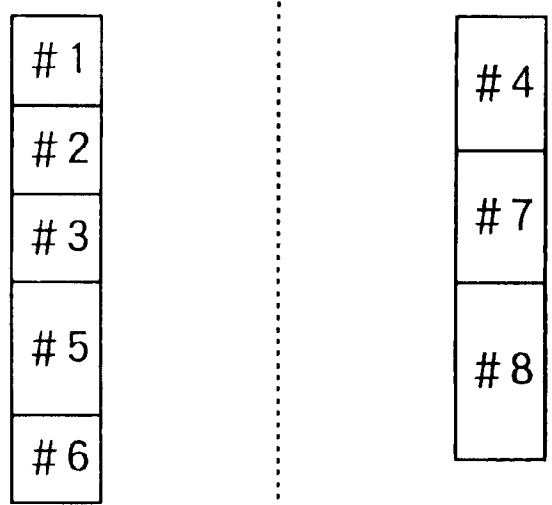
FIGS. 12A and 12B are schematic diagrams of a semiconductor integrated circuit in which a lengthwise one-dimensional array and a lengthwise dividing have been effected.
Figure 12B:
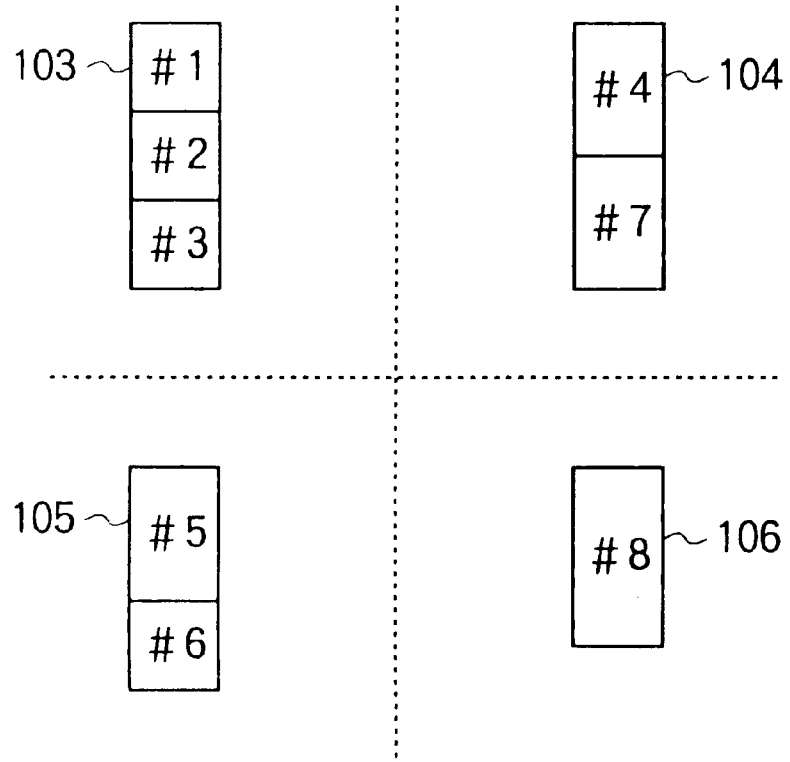

Next, FIGS. 12A and 12B are schematic diagrams of the semiconductor integrated circuit in which the cells are one-dimensionally arrayed in the lengthwise direction and divided in the lengthwise direction. As illustrated in FIG. 12A, as similarly done in the crosswise direction, the cell groups are arrayed in the lengthwise direction, and the sorting process is executed with respect to the Y-axis. Herein, referring to FIG. 11A, the sorting process is executed based on the X-coordinates of the respective cells, while in FIG. 11A the sorting process is implemented base on the Y-coordinates, and therefore it might happen that the orders of the respective cells are to be replaced, it is herein assumed that, for example, the cell No. 5 is replaced with the cell No. 2 in their orders.

Next, as shown in FIG. 12B, the lengthwise division is carried out. On this occasion, the cells in the vicinity of the center are divided up and down according to the central point and the area ratio etc. Thus, the cell groups are divided into four cell groups 103–106. Herein, e.g., the cell group 103 consists of the cells No. 1, No. 2 and No. 3, and the cell group 104 consists of the cells No. 4 and No. 7. The cell group 105 consists of the cells No. 5, No. 6 and No. 8, and the cell group 106 consists of the cell No. 8.

Figure 13A:
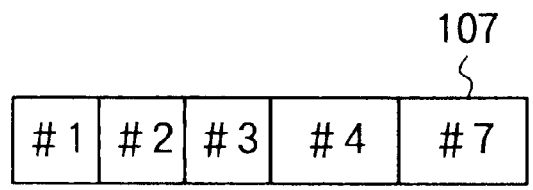
FIGS. 13A and 13B are schematic diagrams of a semiconductor integrated circuit in which a crosswise one-dimensional array and a crosswise dividing have been effected.
Figure 13A:
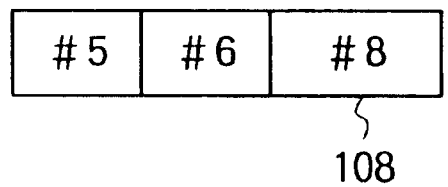
Figure 13B:
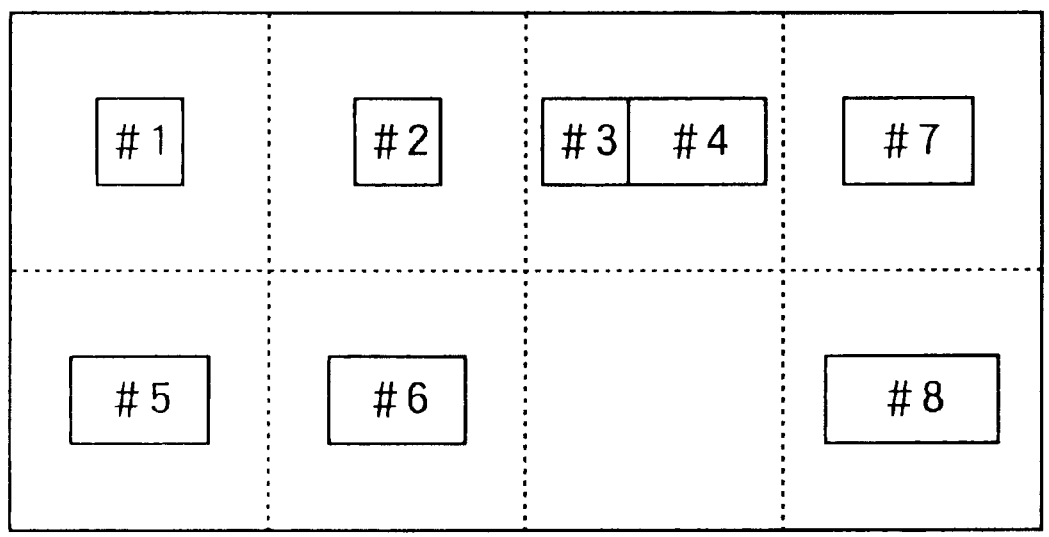

Next, FIGS. 13A and 13B are schematic diagrams of the semiconductor integrated circuit in which the cells are one-dimensionally arrayed in the crosswise direction and divided in the crosswise direction.

Referring to FIG. 12B, the respective cells are arrayed in the two rows and in the two columns, and, though the number of rows [2] of the set final value is met, the number of columns [4] is not attained. Then, an operation of subdividing the columns is to be executed.

The processing operation with respect to the crosswise direction is gain performed. That is, the cell groups 103 and 104 shown in FIG. 12B are merged, thereby forming a cell group 107 as shown in FIG. 12A. Similarly, the cell groups 105 and 106 are merged, thereby forming a cell group 108. Herein, the cell groups 107 and 108 are sorted per row on the basis of the central position of each cell, thereby improving the piecing in an optimal position. Moreover, the cell groups 107, 108 is each divided by four per row.

Thus, as shown in FIG. 13B, the desired cells are optimally disposed in respective positions in the two rows and in the four columns on the chip of the semiconductor integrated circuit. In this step, it might happen in some cases that the positions of the predetermined row and column are empty, or the plurality of cells are disposed.

Figure 14:
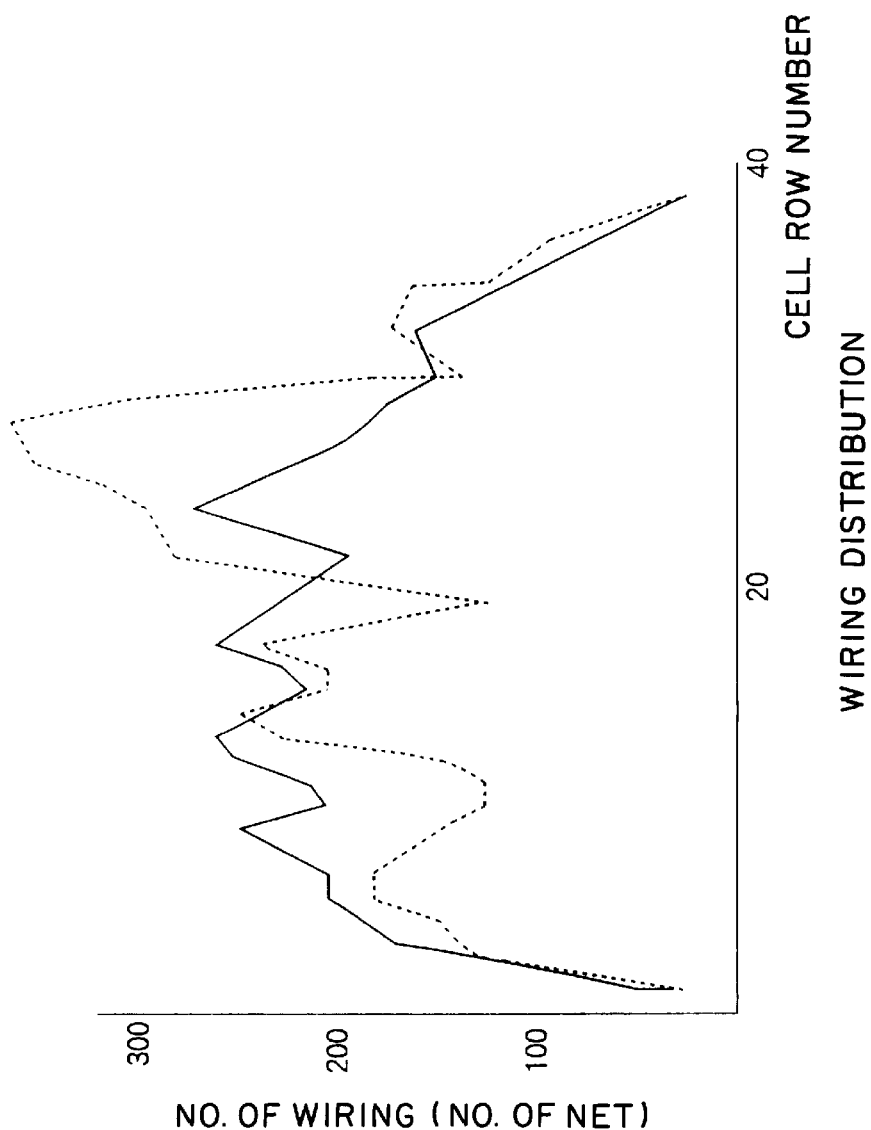
FIG. 14 is a graphic charts showing wiring densities.

Next, FIG. 14 is a graphic chart showing wiring density distributions.

The broken line indicates a wiring density distribution in a case where the cells are laid out by the conventional minimum-cut method, while the solid line indicates a wiring density distribution in a case where the cells are laid out by the automatic cell piecing method according to the present invention. Herein, the axis of abscissa indicates the row number of the cell, and the axis of ordinate indicates the number of wires arranged over the rows of the cells. Further, in this example, it is assumed that the connection describing language data of 7000 pieces of cells and 7000 pieces of nets are laid out in 40 rows and in 16 columns.

In the prior art, as shown by the broken line, although the number of wires becomes small in a position of the cell row number that is divided by 2 or 4, there is a bias in the whole wiring distribution. In contrast with this, when using the cell automatic wiring method according to the present invention, the wiring density is substantially uniform over the respective cell row numbers. Further, when calculating a total wire length in that case, the calculated result was $8.4 \times 10^6$ in the prior art but is $7.2 \times 10^6$ in the present invention, which is an improvement on the order of 14%. Moreover, the entire chip is downsized by 20% at the maximum.

It can be thereby expected that the manufacturing costs are reduced.

Further, a fan-out number defined as the number of cells (the number of nets) connected to an output of a certain cell is examined, and a length of the longest net (the wire) is compared per fan-out number. As a result, it proved that the length is shorted by approximately 20%–40% in the present invention then in the prior art. Moreover, when comparing differences between the wire lengths, the difference therebetween is smaller in the case of using the present invention than in the prior art. This makes is feasible to actualize the wiring with no large deviation from a predicted wire length before the placing as well as to make a path constraint of a plurality of inter flip-flop signal paths existing in the circuit fall within a predetermined constraint with no difference in length between the wires.

As a result, it is possible to remarkably reduce the repetitions to change the placing design and the logic circuit as well, and to decrease the design period and design costs.

Next, another embodiment of the automatic cell placing method according to the present invention, which is made by considering balance in wiring resource. Here, the wiring resource is defined as a maximum wiring (routing) quantity which can be performed in an area where cells are to be placed. If residual wiring resources are widely varied, there will be expected a case where wire routing will be difficult. By this reason, it is necessary that residual wiring resources are necessary to be well-balanced among cells, and therefore it is necessary to recover the balance when the balance is not in good condition.

Figure 15:
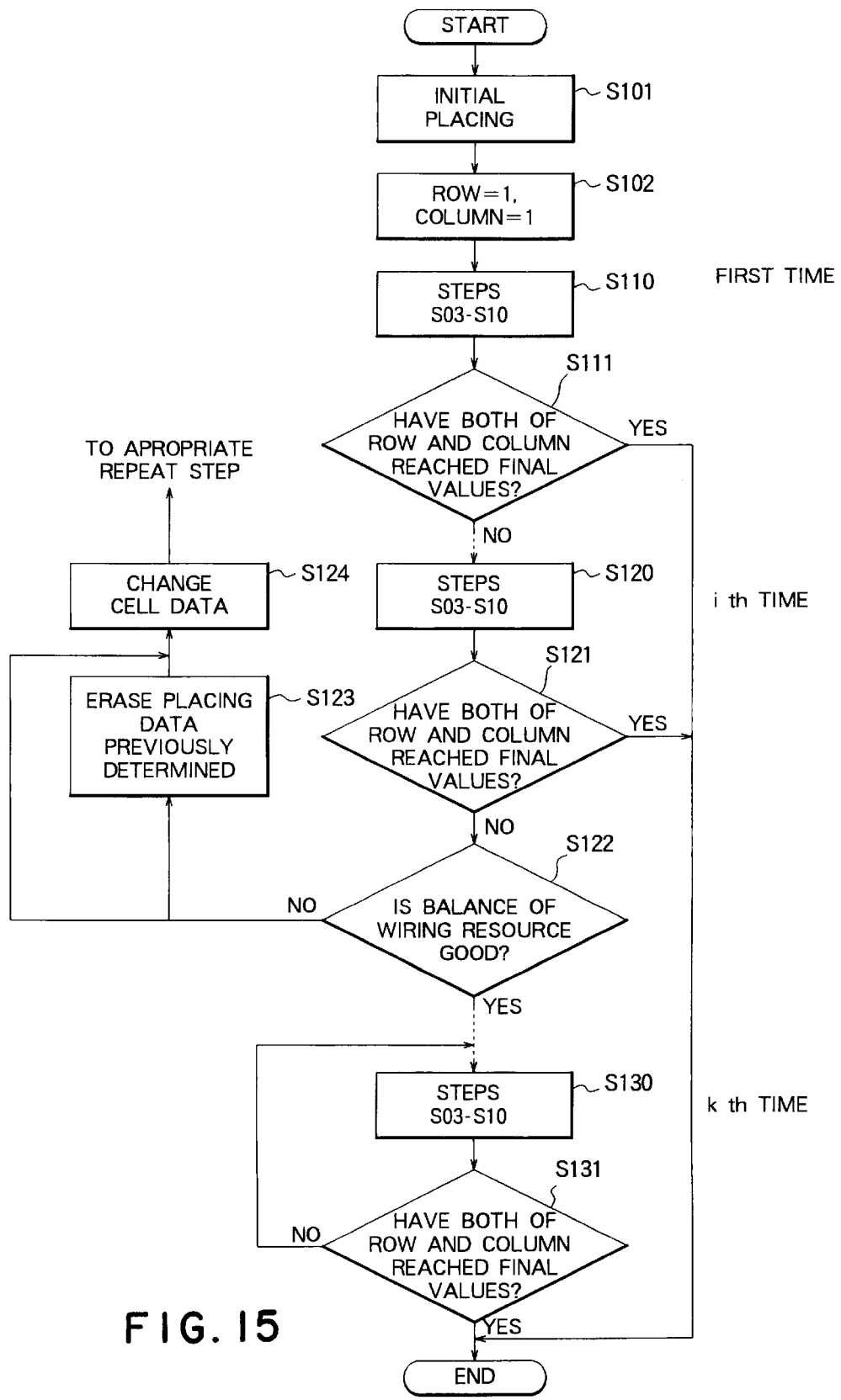
FIG. 15 is a flowchart showing a third embodiment of the present invention, which employs a first method for recovering balance of wiring resource residue.

FIG. 15 is a flowchart showing a third embodiment of an automatic cell placing method according to the present invention, which employs a first method for recovering good balance of residual wiring resource.

According to this embodiment, after steps of initial placing (step S101) and initialization (step S102), a unit of steps S03–S10 is repeated from the first time (step S110) to k th-times (step 130). At an i th-time repeating (step S120), it is checked if a balance of wiring resource is in good condition.

If it is not in good condition, placing data which have been previously determined are erased (step S123) and at least part of cell data is changed (step S124). Then placing procedure will be back to an appropriate precedent repeating step. It is to be noted that to which precedent step the process returns depends on a degree of unbalanced wiring resources.

The changing of the cell data in step S124 involves provisional routing information, provisional change of cell width.

By repeating process from the previous step with changed cell data, a different placing result will be obtained and the unbalance of wiring resource is expected to be recovered.

Furthermore, as shown in FIG. 15, it is not necessary to return to some previous steps. More specifically, at step 122, when the unbalance of residual wiring resource is found, it is possible to proceed to the next repeating step without erasing previous placing data and with changed cell data (step S124).

Figure 16:
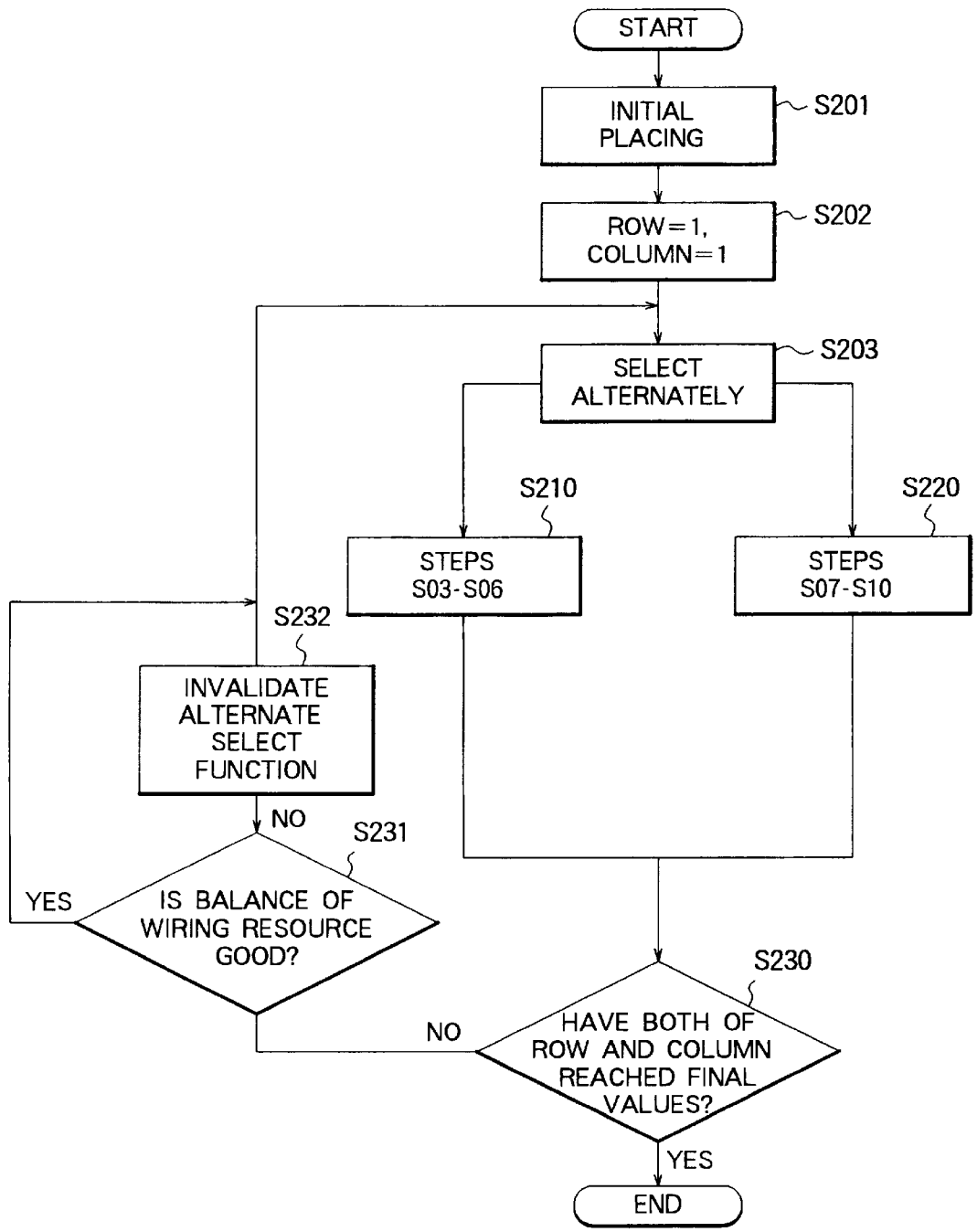
FIG. 16 is a flowchart showing a fourth embodiment of the present invention, which employs a second method for recovering balance of wiring resource residue.
Figure 17:
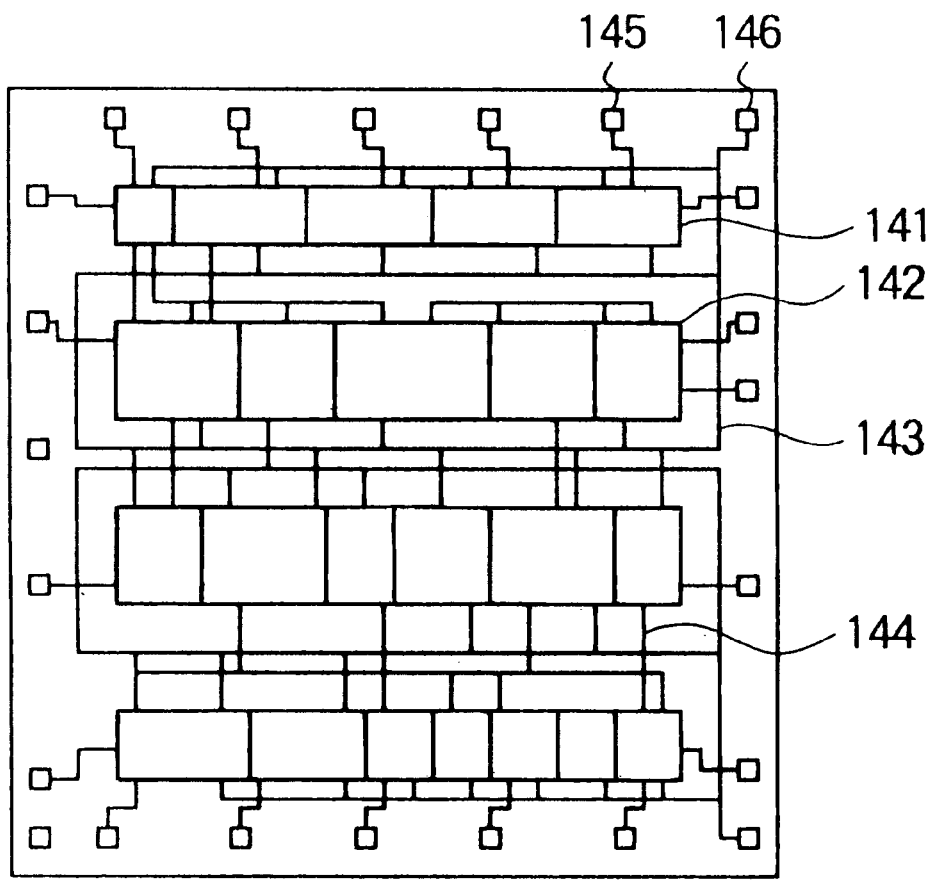
FIG. 17 is a layout diagram of a semiconductor device which has been placing-designed based on a standard cell method and routing.

FIG. 16 is a flowchart showing a fourth embodiment of an automatic cell placing method according to the present invention which employs a second method which employs a second method for recovering good balance of residual wiring resource.

According to this embodiment, after steps of initial placing (step S101) and initialization (step S102), a unit of steps S03–S06 in FIG. 2 (step S210) and a unit of steps S07–S10 in FIG. 2 (step S220) are alternately selected (step S203) and executed. And if both of row and column have not reached final value, balance of residual wiring resource is checked (step S231). If this check result is in good condition, the process is executed as scheduled. However, if the check result is not in good condition, the alternate selective function is temporary halted. As a result, since either one of crosswise or lengthwise process is repeated, the unbalance of wiring resource is expected to be recovered.

Incidentally, in the discussion given above, the cells are laid out two-dimensionally, i.e., in the rows and columns. The cells may be, however, three-or-more-dimensionally laid out by increasing the coordinate parameters. Especially when arrayed three-dimensionally, the present invention can be applied to designs of the semiconductor device including a plurality of layers.

Furthermore, although the shape of cell is assumed as square or rectangular in the above-explained embodiments, the present invention is not necessary limited to such shape, and other arbitrary shape can be applicable.

According to the automatic cell placing method as described in the present invention, a degree of integration can be enhanced in the placing design based on the standard cell system, and, besides, a desired placing design is completed with a single design work, whereby the production coats, the design period and the design coats can be remarkably reduced.

Further, the automatic cell placing method as shown in the present invention, because of repetitive dividing and merging operations based on the simple one-dimensional array, is highly suited to meeting the path constraints of asking an influence by a floor plan of the whole semiconductor device hard to receive, and giving a constraint to a signal delay time between the flip-flops in the circuit, or giving a one-dimensional cell array constraint.

Moreover, the placing along a flow of signals can be made, a degree of wiring congestion can be made moderate, and the bias in wiring can be eliminated.

What is claimed is:

1. An automatic cell placing method comprising:

an arraying step of forming a cell group by arraying a plurality of cells one-dimensionally in a lengthwise direction or a crosswise direction by only lengthwise or crosswise components of external terminals per column or row on the basis of connection data of the respective cells;

a dividing step of dividing the cell groups formed in said arraying step into a predetermined number of cell groups per column or row in the lengthwise or crosswise direction; and a merging step of forming other cell groups by merging the plurality of cell groups obtained by the lengthwise division in said dividing step in a predetermined number of one-dimensional crosswise directions or by merging the plurality of cell groups obtained by the crosswise division in said dividing step in a predetermined number of one-dimensional lengthwise directions, wherein said automatic cell placing method is based on a standard cell system in which the plurality of cells are laid out two-or-more-dimensionally to have a predetermined number of rows of columns by alternatively repeating respective processing operations in said arraying step and said dividing step with respect to the lengthwise components and the crosswise components, and wherein other cell groups formed in said merging step are arrayed in said arraying step and wherein steps in crosswise direction and steps in lengthwise direction are alternatively repeated.

2. The automatic cell placing method according to claim 1, wherein said dividing step is a step of dividing the cell group into the predetermined number of cell groups on the basis of an area ratio of each cell, a central position thereof or any one of positions of left, right, upper and lower edge points thereof.

3. The automatic cell placing method according to claim 1, wherein said arraying step further includes a sorting step of improving the placing by sorting the arraying orders on the basis of the connection data of the respective cells, said connection data including data on a size of the cell and connection relationships with other cells and the external terminals.

4. The automatic cell placing method according to claim 3, wherein the method further comprises a step of checking balance of residual wiring resources and a step of alternately selecting a first series of merging, improving placing and dividing steps in crosswise direction or a second series of merging, improving placing and dividing steps in lengthwise direction when the balance is in good condition and a step of halting the alternately selecting when the balance is not in good condition.

5. The automatic cell placing method according to claim 3, wherein the method further comprises a step of checking balance of residual wiring resources after a predetermined repeating of repeating unit including a first series of merging, improving placing and dividing steps in crosswise direction and a second series of merging, improving placing and dividing steps in lengthwise direction, if the balance is not good, further comprises a step of changing cell data and a step of transferring to an appropriate repeat step.

6. The automatic cell placing method according to claim 5, wherein said transfer step includes proceeding to the next repeating step with a part of cell data simply being changed.

7. The automatic cell placing method according to claim 5, wherein said transfer step includes erasing step for erasing placing data previously determined and to moving step to move to and appropriate previous repeat step.

8. The automatic cell placing method according to claim 1, wherein said dividing step is a step of setting the number of divisions so that when divided into the predetermined number of cell groups, the cell group is at first divided into two cell groups, and thereafter sequentially $2^n$-divisions (n is the number of processing operations and an integer of 2 or more) are executed when going through the processing operation in said dividing step.

9. An automatic cell placing method of executing a placing design of a semiconductor device by a standard cell system, comprising:

a crosswise one-dimensional arraying step of forming a first cell group by arraying the third cell group per row one-dimensionally in the crosswise direction by only crosswise components of external terminals on the basis of connection data of the respective cells;

a crosswise dividing step of forming a second cell group by executing $2^n$-divisions (n is the number of processing operations and is an integer), per row, of the crosswise cell group formed in said crosswise one-dimensional arraying step;

a lengthwise merging step of forming a third cell group by merging, per column and per lengthwise direction, the cell groups obtained by affecting the divisions in said crosswise dividing step;

a lengthwise one-dimensional arraying step of forming a fourth cell group by arraying the third cell group per column one-dimensionally in the lengthwise direction by only lengthwise components of the external terminals, said third cell group being obtained by the merging process in said lengthwise merging step;

a lengthwise dividing step of forming a fifth cell group by executing, per column, $2^n$ divisions (n is the number of processing operations and is an integer) of the fourth cell group formed in said lengthwise one-dimensional arraying step; and a crosswise merging step of forming the fifth cell group by merging, per row, the cell groups obtained by the divisions in said lengthwise dividing step, wherein the plurality of cells are laid out two-or-more-dimensionally by appropriately repeating a series of lengthwise operating processes of said crosswise merging step, said crosswise one-dimensional arraying step, and said crosswise dividing step, and a series of crosswise processing operations of said lengthwise merging step, said lengthwise one-dimensional arraying step and said lengthwise dividing step in the lengthwise or crosswise direction in accordance with a predetermined number of rows and a predetermined number of columns.

10. The automatic cell placing method according to claim 9, wherein the connection data include data on a size of the cell and connecting relationships with other cells and the external terminals.

11. An automatic cell placing method of executing a placing design of a semiconductor device by a standard cell system, comprising:

a lengthwise one-dimensional arraying step of forming a first cell group by arraying a plurality of cells per column one-dimensionally in a lengthwise direction by only lengthwise components of external terminals on the basis of connection data of the respective cells;

a lengthwise dividing step of forming a second cell group by executing $2^n$-divisions (n is the number of processing operations and is an integer), per column, of the lengthwise cell group formed in said lengthwise one-dimensional arraying step;

a crosswise merging step of forming a third cell group by merging, per row and per crosswise direction, the cell groups obtained by effecting the divisions in said lengthwise dividing step;

a crosswise one-dimensional arraying step of forming a fourth cell group by arraying the third cell group per row one-dimensionally in the crosswise direction by only crosswise components of the external terminals, said third cell group being obtained by the merging process in said crosswise merging step;

a crosswise dividing step of forming a fifth cell group by executing, per row, $2^n$ divisions (n is the number of processing operations and is an integer) of the fourth cell group formed in said crosswise one-dimensional arraying step; and a lengthwise merging step of forming the fifth cell group by merging, per column, the cell groups obtained by the divisions in said crosswise dividing step, wherein the plurality of cells are laid out two-or-more-dimensionally by appropriately repeating a series of lengthwise operating processes of said lengthwise merging step, said lengthwise one-dimensional arraying step, and said lengthwise dividing step, and a series of crosswise processing operations of said crosswise merging step, said crosswise one-dimensional arraying step and said crosswise dividing step in the lengthwise or crosswise direction in accordance with a predetermined number of rows and a predetermined number of columns.

12. The automatic cell placing method according to claim 11, wherein the connection data include data on a size of the cell and connecting relationships with other cells and the external terminals.

* * * * *